US007945607B2

(12) United States Patent
Hinds

(10) Patent No.: US 7,945,607 B2
(45) Date of Patent: May 17, 2011

(54) DATA PROCESSING APPARATUS AND METHOD FOR CONVERTING A NUMBER BETWEEN FIXED-POINT AND FLOATING-POINT REPRESENTATIONS

(75) Inventor: Christopher Neal Hinds, Landbeach (GB)

(73) Assignee: ARM Limited, Cambridge (GB)

( * ) Notice: Subject to any disclaimer, the term of this patent is extended or adjusted under 35 U.S.C. 154(b) by 1027 days.

(21) Appl. No.: 11/798,547

(22) Filed: May 15, 2007

(65) Prior Publication Data

US 2007/0220076 A1  Sep. 20, 2007

Related U.S. Application Data

(62) Division of application No. 10/329,765, filed on Dec. 27, 2002, now Pat. No. 7,236,995.

(51) Int. Cl.
*G06F 15/00* (2006.01)
(52) U.S. Cl. ...................................................... 708/204
(58) Field of Classification Search .................. 708/204
See application file for complete search history.

(56) References Cited

U.S. PATENT DOCUMENTS

| 3,930,232 | A | 12/1975 | Wallach et al. |
| 3,961,170 | A | 6/1976 | De Sandre et al. |
| 4,511,990 | A | 4/1985 | Hagiwara et al. |
| 4,592,006 | A | 5/1986 | Hagiwara et al. |
| 4,620,292 | A | 10/1986 | Hagiwara et al. |
| 4,631,696 | A | 12/1986 | Sakamoto |
| 4,805,128 | A | 2/1989 | Nelsen et al. |
| 6,028,893 | A | 2/2000 | Schreib |
| 6,049,343 | A | 4/2000 | Abe et al. ........................ 345/501 |
| 6,144,977 | A | 11/2000 | Giangarra et al. ............. 708/204 |
| 6,510,446 | B1 | 1/2003 | Fukagawa ....................... 708/497 |
| 6,606,097 | B1 | 8/2003 | Fossum ........................... 345/501 |
| 6,671,796 | B1 | 12/2003 | Sudharsanan et al. |
| 2003/0065698 | A1* | 4/2003 | Ford ............................... 708/204 |

FOREIGN PATENT DOCUMENTS

| EP | 0 051 422 | 5/1982 |
| EP | 0 182 963 | 6/1986 |
| GB | 2 149 162 | 6/1985 |

(Continued)

OTHER PUBLICATIONS

English translation of Japanese Appeal Board's Questioning dated Jul. 16, 2010 for JP 2003-391602.

(Continued)

*Primary Examiner* — Tan V Mai
(74) *Attorney, Agent, or Firm* — Nixon & Vanderhye P.C.

(57) ABSTRACT

A data processing apparatus and method are provided for converting a number between fixed-point and floating-point representations. More particularly, the data processing apparatus comprises a data processing unit operable to execute instructions, with the data processing unit being responsive to a format conversion instruction to apply a format conversion operation to a number to perform a conversion between the fixed-point representation of the number and the floating-point representation of the number. Furthermore, a control field is provided which is arranged to provide a programmable value specifying a decimal point location within the fixed-point representation of the number, and the data processing unit is operable to reference the control field and to control the formal conversion operation in accordance with the programmable value. This enables a single instruction to be used to directly convert between fixed-point formats (where the position of the decimal point may be programmable varied) and floating-point representations.

17 Claims, 8 Drawing Sheets

FOREIGN PATENT DOCUMENTS

| | | |
|---|---|---|
| JP | 5 707 6634 | 5/1982 |
| WO | WO 96/27831 | 9/1996 |

OTHER PUBLICATIONS

English abstract and partial English translation of JP 61-075431, Apr. 1986.

English abstract of JP 61-016325, Jan. 1986.

English abstract and partial English translation of JP 55-159248, Dec. 1980.

English abstract of JP 01-207823, Aug. 1989.

English abstract and partial English translation of JP 05-334074, Dec. 1993.

Japanese Office Action and Summary of Japanese Office Action, Feb. 15, 2011, in corresponding Japanese Application No. JP 2003-391602.

"Melcom OS60/UMX Assembler Explanatory booklet", QM-SR00-60A<84A2>, 9$^{th}$ impression of the 3$^{rd}$ edition, Mitsubishi Electronic Corporation, Information Systems Engineering Center, Oct. 20, 1994, pp. 23-35, p. 233.

Well-known art 2: "TRON Specification FPU Standard Handbook", 1$^{st}$ impression of the 1$^{st}$ edition, Personal Media Corporation, Aug. 20, 1992, p. 64-74.

* cited by examiner

DATA PROCESSING APPARATUS AND METHOD FOR CONVERTING A NUMBER BETWEEN FIXED-POINT AND FLOATING-POINT REPRESENTATIONS

This application is a Division of application Ser. No. 10/329,765, filed Dec. 27, 2002, now U.S. Pat. No. 7,236,995. The entire content of this application is incorporated herein by reference.

BACKGROUND OF THE INVENTION

Background

The technology described in this application relates to a data processing apparatus and method for converting a number between fixed-point and floating-point representations.

General purpose processors are known which can perform computation on two basic formats of data, namely integer data and floating-point data. The general purpose processor will typically include an integer hardware processing unit for processing integer numbers and a floating-point hardware processing unit for processing floating-point numbers.

In association with such general purpose processors, hardware techniques are known for converting integer numbers into floating-point numbers, and floating-point numbers into integer numbers, to allow transfer of data between the integer processing logic and the floating-point processing logic. Two examples of such conversion techniques are described in U.S. Pat. No. 3,961,170 and U.S. Pat. No. 4,631,696. Although both of these patents refer to conversion from "fixed-point" numbers to floating-point numbers, it should be noted that the fixed-point numbers they are describing in those patents are integers, i.e. the decimal point position is immediately to the right of the least significant bit.

In the more general sense, a fixed-point representation of a number is one in which the location of the decimal point within the n-bit number is programmable, and accordingly an integer number can be viewed as merely one specific example of a fixed-point representation, namely an example where the decimal point is located immediately to the right of the least significant bit. Hence, an unsigned fixed-point representation U(a,b) is one where the total number of bits n is equal to a+b, where a bits are to the left of the decimal point and b bits are to the right of the decimal point. Similarly, a signed fixed-point representation S (a,b) is one in which the total number of bits n is equal to a+b+1, where one bit is used to represent the sign bit. Again, there will be a bits to the left of the decimal point and b bits to the right of the decimal point.

Some examples of the U(a,b) and S(a,b) formats are as follows:

S(15,0)—the signed 16-bit integer format sometimes known as an int on a PDP-11 system, with a range of −32768 to +32767.

S(31,0)—the signed 32-bit integer format known as a "signed word" on ARM processors implementing architecture version 4 and above, with a range of −2,147,483,648 to +2,147,483,647. Likewise U(32,0) is known as a "unsigned word" on ARM processors, with a range of 0 to +4,294,967, 296. In all these cases, the least significant bit represents the quantity 1. It is then said that this data type has a resolution of 1 or $2^0$.

Examples of fixed-point data types for which the b term is non-zero are as follows:

U(8,8)—has 8 bits to the right of the decimal point, making up a fractional portion in which the least significant bit represents the quantity $2^{-8}$, or 0.00390625. The range is simply 0 to 256, with a resolution of $2^{-8}$.

In a similar manner, a S(13,2) number has a range of −8192 to +8191.75, with a resolution of $2^{-2}$ or 0.25.

In the embedded processor environment, where cost and size are paramount considerations, it has up to now been considered appropriate only to provide the embedded processor with an integer hardware processing unit and no floating-point hardware processing unit. Fixed-point algorithms have then been developed that enable data to possess a range outside of that available to integer numbers (for example a range less than one). Whilst within the programming environment, the fixed-point representations are understood, the integer hardware processing logic within the embedded processor will always treat the operands as integers, and hence will not process fixed-point numbers other than integer numbers properly for all operations. As a result, additional operations are required to ensure correct handling of fixed-point representations of numbers within the integer processing logic of the processor.

As an example of such an additional operation, a multiplication operation may be required. When two fixed-point values of type U(a1,b1) and U(a2,b2) are multiplied together, the resulting product is in U(a1+a2,b1+b2) form. To return it to either of the two formats requires the value to be scaled and either truncated or rounded. The scaling required is a multiplication by $2^{-x}$, where x is the fraction term (b1 or b2) of the format not selected, and the extraction of the n most-significant bits, where n is number of excess bits to the left of the decimal point and is (a1+a2) less the integer term (a1 or a2) of the unused format. It must be noted that all operations can overflow the destination format, as can the more common integer formats.

SUMMARY OF THE INVENTION

Viewed from a first aspect, the technology described in this application provides a data processing apparatus, comprising: a data processing unit operable to execute instructions; the data processing unit being responsive to a format conversion instruction to apply a format conversion operation to a number to perform a conversion between a fixed-point representation of said number and a floating-point representation of said number, a control field being arranged to provide a programmable value specifying a decimal point location within the fixed-point representation of said number, and the data processing unit being operable to reference the control field and to control the format conversion operation in accordance with the programmable value.

The inventors have realised that it is now becoming cost effective to provide floating-point hardware within processing units that may previously have omitted such floating-point hardware, for example embedded processors. Further, the inventors realised that in the floating-point environment, much of the additional operations that are often necessary when manipulating fixed-point numbers within integer hardware are no longer required. Furthermore, in some situations floating-point operations will be quicker than the equivalent operations performed to manipulate fixed-point numbers within the integer hardware (for example vector floating-point operations, etc). However, the inventors also realised that there will be many situations where the data sets are most efficiently stored in memory in a fixed-point representation. For example, speech data may be adequately represented by 13 bits, and hence is more efficiently stored as a 16-bit fixed-point representation rather than a single-precision floating-point representation, which requires 32-bits.

Accordingly, the inventors realised that if the benefits of floating-point computations were to be realised within such environments, then a quick and efficient technique would be required for converting between a fixed-point representation of a number and a floating-point representation of a number.

This is achieved by providing a format conversion instruction which causes the data processing unit to apply a format conversion operation to a number to perform a conversion between a fixed point representation of the number and a floating point representation of the number. A control field is arranged to provide a programmable value specifying the decimal point location within the fixed point representation of the number, and the data processing unit references the control field in order to be able to control the format conversion operation in accordance with the programmable value. Hence, in contrast to the prior art conversions between integer and floating point representations, the data processing unit is "fixed point aware", in that information is provided about the location of the decimal point, and the conversion performed takes account of that decimal point location when performing the conversion. Accordingly, a single instruction can be used to provide fast conversion between a fixed-point number and a floating-point number, with the position of the decimal point location within the fixed point representation being programmable as required. In preferred embodiments, the programmable value is programmable for each conversion operation.

It will be appreciated that the control field may be provided in a number of ways. In one embodiment, a control register may be provided within the data processing apparatus for provision of the control field. The programmable value may then be programmed within the control register as and when required, with the data processing unit referencing that control register when executing a format conversion instruction in order to determine the decimal point location, and hence control the format conversion operation accordingly.

In alternative embodiments, the control field is provided within the format conversion instruction itself, and accordingly the control field is specified specifically for each instance of the format conversion instruction. In one such embodiment, the programmable value is provided as an "immediate" value within the control field, and accordingly is specified directly by the format conversion instruction. However, alternatively, the control field within the format conversion instruction may identify an operand register in which the programmable value is stored. Irrespective of which of these two approaches is taken, it will be appreciated that specification of the control field within the format conversion instruction itself inherently provides greater flexibility as to the specification of the decimal point location on a per instruction basis than would be available if the control field was specified within the control register or a specific operand register.

In preferred embodiments, a further control field is arranged to specify whether the fixed-point representation of said number is signed or unsigned. In preferred embodiments, this further control field is provided within the format conversion instruction itself, and accordingly the further control field is specified for each instance of the format conversion instruction. In one embodiment, the further control field is part of the opcode of the format conversion instruction, such that two different variants exist of each format conversion instruction, one for signed, and one for unsigned, fixed-point representations.

It will be appreciated that the data processing unit may take a variety of forms. However, in preferred embodiments, the data processing unit is a pipelined processor, and the format conversion operation is performed within a plurality of pipeline stages of the pipelined processor.

In a particular embodiment, the pipelined processor is a floating-point pipelined processor comprising exponent processing logic located within the plurality of pipeline stages and significand processing logic located within the plurality of pipeline stages, and the exponent processing logic and significand processing logic are operable to apply the format conversion operation. Hence, the exponent processing logic and significand processing logic provided for performing a variety of computations on floating-point numbers are also preferably used in preferred embodiments to apply the format conversion operation required to execute the format conversion instruction.

In one embodiment, the format conversion instruction is a fixed-point to floating-point conversion instruction and the format conversion operation applied to the number is operable to perform a conversion from a fixed-point representation of said number to a floating-point representation of said number. In one preferred embodiment, the fixed-point representation may be either signed or unsigned, and either a half word (i.e. 16 bits) or a long word (i.e. 32 bits). Similarly, the floating-point representation may be single precision or double precision. Accordingly, in preferred embodiments, eight variants of the format conversion instruction are provided to allow conversion from each of the fixed-point representations into each of the floating-point representations.

In preferred embodiments, the format conversion operation includes an exponent generation operation operable to generate an exponent value for the floating-point representation of the number by performing an operation equivalent to subtracting from an initial exponent value a value indicative of the number of leading zeros in the fixed-point representation of the number, and the format conversion operation being operable, prior to said exponent generation operation, to adjust the initial exponent value based on the programmable value provided within the control field. Hence, the format conversion operation is "fixed-point aware" in that the initial exponent value used in the operation is adjusted dependent on the programmable value specifying the decimal point location. This ensures that the floating-point representation produced is dependent on the fixed-point representation of the number, and the fixed-point representation of the number is not merely treated as an integer for the purposes of the conversion.

In preferred embodiments, the data processing unit is a pipelined processor, the format conversion operation being performed within a plurality of pipeline stages of the pipelined processor, and the adjustment of the initial exponent value being performed in a predetermined pipeline stage prior to one or more pipeline stages in which the exponent generation operation is performed. This ensures that the initial exponent value has been adjusted as required prior to the exponent generation operation being performed.

In preferred embodiments, the predetermined pipeline stage comprises adjustment logic operable to adjust the initial exponent value by performing an operation equivalent to subtracting from a default initial exponent value the programmable value provided within the control field. In one particular embodiment, this subtraction process is actually performed by inverting the programmable value, and adding it, along with the addition of a logic one value, to the initial exponent value.

In one embodiment, the format conversion instruction is a floating-point to fixed-point conversion instruction and the format conversion operation applied to the number is operable to perform a conversion from the floating-point representation of said number to the fixed-point representation of said number. As mentioned earlier, the floating-point representation may in preferred embodiments be a single-precision floating-point representation or a double-precision floating-point representation, whilst the fixed-point representation may be signed or unsigned, and may be a half word representation or a long word representation. Accordingly, in preferred embodiments, eight variants of the format conversion instruction are provided to allow conversion from each type of floating-point representation to each type of fixed-point representation. Furthermore, in particularly preferred embodiments, both floating-point to fixed-point format conversion instructions and fixed-point to floating-point format conversion instructions are provided.

As will be appreciated, the floating-point representation of the number provides an exponent value and a significand value. Considering the floating-point to fixed-point conversion instruction, the format conversion operation preferably includes an exponent difference determination operation operable to determine a shift count value based on a comparison of the exponent value with a predetermined value, and a shift operation operable to apply a shift to the significand value based on the shift count value, the exponent difference determination operation being operable to use the programmable value in the determination of the shift count value. Accordingly, the format conversion operation is made "fixed-point aware" in that the location of the decimal point is taken into account when determining the shift count value to be used to apply a shift to the significand value, and accordingly the fixed-point representation output as a result of the format conversion operation will be in the required fixed-point form, without any further manipulation of the bits being required.

In preferred embodiments, the exponent difference determination operation is operable to determine the shift count value by performing an operation equivalent to subtracting the exponent value and the programmable value from the predetermined value. In on embodiment, this subtraction operation is achieved by inverting the exponent value and the programmable value and adding the inverted exponent value and the inverted programmable value, along with the addition of a logic one value, to the predetermined value.

As will be appreciated by those skilled in the art, the floating-point representation of the number further provides a sign value. In preferred embodiments, the format conversion operation further includes a significand modifying operation operable, prior to the shift operation, to perform any modification of the significand value required by the sign value. Hence, by the time the shift operation is performed, any required modification of the significand value to take account of the sign value has already occurred.

In one embodiment, the data processing unit is a pipelined processor, the format conversion operation being performed within a plurality of pipeline stages of the pipelined processor, the exponent difference determination operation being performed in a predetermined pipeline stage prior to one or more pipeline stages in which the shift operation is performed. Accordingly, by this approach, it can be ensured that the exponent difference determination operation has been completed prior to a shift operation being performed.

In preferred embodiments, the predetermined pipeline stage comprises exponent difference determination logic operable to perform an operation equivalent to subtracting the exponent value and the programmable value from the predetermined value in order to determine the shift count value.

It will be appreciated by those skilled in the art that the fixed-point representation produced by the format conversion instruction is able to represent a predetermined range of numbers, with that range being dependent upon the total number of bits in the fixed-point representation, whether the fixed-point representation is signed or unsigned, and where the decimal point is located. Typically, the floating-point representation will be able to represent a significantly larger range of numbers than the fixed-point representation, and accordingly it is possible that when converting from the floating-point representation to the fixed-point representation, the number will be outside of the range of numbers that can be represented within the fixed-point representation. Accordingly, in preferred embodiments, the apparatus further comprises exception detecting logic operable to detect based on the exponent value and the programmable value an out of range exception where the number cannot be represented within the predetermined range, and if an out of range exception is detected to cause a default result to be generated as the fixed-point representation of the number.

In preferred embodiments, an out of range exception occurs if the floating-point number is larger than that representable within the fixed-point representation. Accordingly, for a signed fixed-point representation, an out of range exception will occur if the floating-point number is a positive number larger than the maximum positive value expressible within the fixed-point representation, or is a negative number larger in absolute magnitude than the maximum negative value (in absolute magnitude) representable within the fixed-point representation. Similarly, if the fixed-point representation is an unsigned representation, then an out of range exception will occur if the floating-point number is larger than the maximum number expressible within the fixed-point representation.

In preferred embodiments, the default result generated upon detection of an out of range exception is the largest allowable value representable within the fixed-point representation. Hence, for an unsigned fixed-point representation, the default result will be the largest value expressible within the fixed-point representation, and for a signed fixed-point representation, the default result will either be the largest positive value or the largest negative value (in absolute magnitude) expressible, dependent on whether the floating-point number that is determined to have been out of range was a positive number or a negative number.

In preferred embodiments, the exception detecting logic is not required to detect when the floating-point representation of the number is too small to fit within the available range of the fixed-point representation, since in such instances the format conversion operation will automatically replace such values with a 0.

As an alternative to causing the default value to be generated if an out of range exception is detected, the exception detection logic may be arranged to invoke an exception handling routine to process the exception.

In some implementations, it is possible to detect exceptions pessimistically during an early pipeline stage, i.e. determining whether an exception may (as opposed occur, and referring all such detected exceptions to an exception handling routine. Accordingly, in such embodiments, the exception detection logic is further operable to detect a potential out of range exception in which a rounding operation to be applied to form the fixed-point representation of the number may cause the out of range exception to occur. Preferably, in such situations, an exception handling routine is invoked to handle the conversion process.

Alternatively, rather than invoking an exception handling routine in such situations, a control register in the data processing apparatus can be set such that the instruction is instead allowed to pass through the remainder of the pipelined processor, with the default value being generated if the rounding operation causes the out of range exception to occur.

In one embodiment, the data processing unit is a pipelined processor, the format conversion operation being performed within a plurality of pipeline stages of the pipelined processor, the exponent difference determination operation being performed in a predetermined pipeline stage prior to one or more pipeline stages in which the shift operation is performed, and wherein the exception detecting logic is provided within said predetermined pipeline stage. Hence, in such embodiments, both the exponent difference determination operation and the exception detection operation are performed within the same pipeline stage.

Viewed from a second aspect, the technology described in this application provides a method of converting a number between a fixed-point representation of said number and a floating-point representation of said number within a data processing apparatus comprising a data processing unit operable to execute instructions, the method comprising the steps of: providing within a control field a programmable value specifying a decimal point location within the fixed-point representation of said number; and responsive to a format conversion instruction, causing the data processing unit to apply a format conversion operation to said number to perform a conversion between the fixed-point representation of said number and the floating-point representation of said number, including causing the data processing unit to reference the control field and to control the format conversion operation in accordance with the programmable value.

Viewed from a third aspect, the technology described in this application provides a computer program stored on a non-transitory storage medium and containing a format conversion instruction operable to configure a data processing apparatus to perform a method in accordance with the second aspect. Viewed from another aspect, the technology described in this application provides a carrier medium comprising a computer program in accordance with the third aspect. It will be appreciated by those skilled in the art that the carrier medium may take the form of a non-volatile or volatile memory device.

DESCRIPTION OF EXAMPLE EMBODIMENTS

As mentioned earlier, a processing unit may be arranged to execute instructions that are defined to operate upon either an integer data type or a floating-point data type. Whilst the integer processing logic within a processor will treat the operands as integer data, within the programming environment these values can be given a fixed-point interpretation with the position of the decimal point within the operands being selectable. Since the hardware is not "fixed-point aware", then the running of fixed-point algorithms on the integer hardware of the processor requires the use of additional operations to ensure correct processing of the fixed-point values within the integer hardware, for example bit manipulation following a multiply operation, re-scaling of results, etc.

Figure 1A:
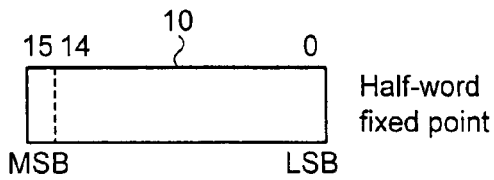
FIGS. 1A and 1B illustrate different fixed-point representations of numbers that may be used in preferred example embodiments.

FIG. 1A is a diagram illustrating a half-word fixed-point representation of a number, i.e. a 16 bit representation. If the half-word is an unsigned half-word, then all 16 bits can be used to specify the fixed-point value, whereas if the half-word is a signed half-word, then bit 15, i.e. the most significant bit, is used to indicate the sign of the fixed-point value, a 0 typically indicating a positive value and a 1 typically indicating a negative value. The remaining 15 bits are then used to represent the value itself.

Figure 1B:
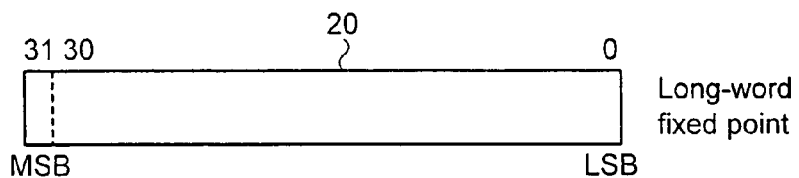

An analogous situation arises for a long word fixed-point representation as illustrated in FIG. 1B, where for an unsigned fixed-point value all 32 bits are used to represent the value, whilst for a signed fixed-point value bit 31, i.e. the most significant bit, is used to contain the sign information, with the remaining 31 bits being used to represent the actual data value.

With regards to the number of bits used to represent the actual data value, then "a" bits can be considered to be to the left of the decimal point, with the remaining "b" bits being considered to be to the right of the decimal point. In the programming environment, the positioning of the decimal point will be known, whilst in the hardware itself, the integer hardware will not be aware of the decimal point location and will instead treat the fixed-point value as an integer value for any computations performed by the hardware. For the purposes of the following description, an unsigned fixed-point number will be represented as U(a,b), whilst a signed fixed-point number will be represented as S(a,b).

In contrast to fixed-point numbers, floating-point numbers are of the form $(+/-) 1.xx \times 2^y$. The value "1.x" is referred to as the significand, of which the value "x" is referred to as the fraction. The value "y" is referred to as the exponent. The manner in which these values are expressed within floating-point numbers will now be illustrated with reference to FIGS. 2A and 2B.

Figure 2A:
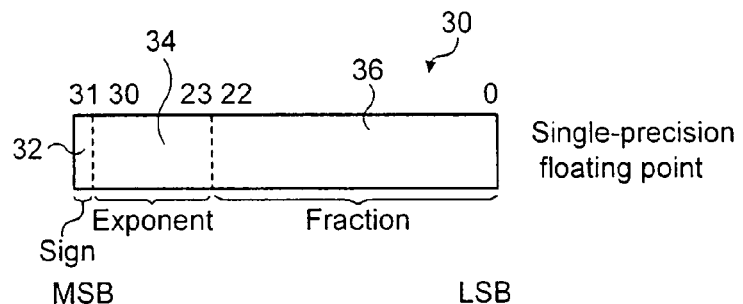
FIGS. 2A and 2B illustrate different floating-point representations that may be used in preferred example embodiments.

The format of floating-point numbers is defined in a standard called the "IEEE Standard for Binary Floating-Point Arithmetic", ANSI/IEEE standard 754/1985, The Institute of Electrical and Electronic Engineers Inc, New York, 10017 (hereafter referred to as the IEEE 754/1985 standard). The format of a single-precision floating-point number as specified by the IEEE 754/1985 standard is shown in FIG. 2A. As apparent from FIG. 2A, a single-precision floating-point number 30 consists of 32 bits, spilt into three fields 32, 34, 36.

The first field 32 contains the most significant bit, and is used to specify the sign of the floating-point number. The second field 34 consists of bits 23 to 30, and is used to specify the value of the exponent, whilst the first field 36 consists of bits 0 to 22, and is used to specify the fraction. Similarly, for a double-precision floating-point number 40, which consists of 64 bits, then as illustrated in FIG. 2B a first field 42 contains the most significant bit, which is used to identify the sign of the floating-point number, a second field 44 contains bits 52 to 62 and is used to represent the exponent, whilst a third field 46 contains bits 0 to 51, and is used to identify the fraction.

Figure 2B:
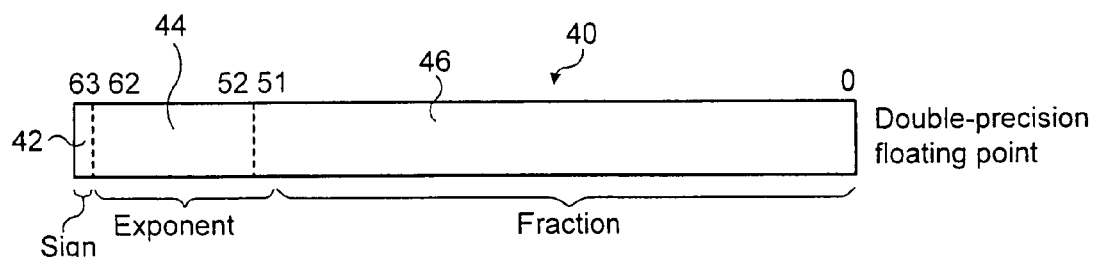

A processor that is operable to process floating-point numbers will typically include a floating-point hardware unit which understands the single-precision and double-precision formats illustrated in FIGS. 2A and 2B. Accordingly, once that hardware unit is told that a particular 32 bit value is a single-precision floating-point number, it will be aware of the fields 32, 34, 36 within that 32 bit value, and what the values within those fields represent. Similarly, once the floating-point hardware has been told that two 32 bit registers contain a 64 bit double-precision floating-point number, it will again be aware of the presence of the fields 42, 44, 46 and the relevance of the data contained within those fields.

Figure 3A:
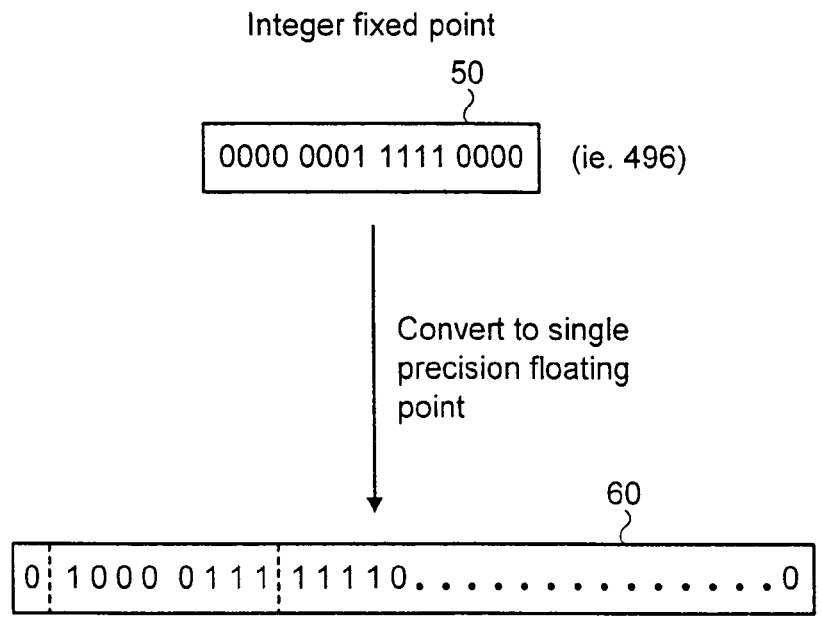
FIGS. 3A and 3B illustrate the conversion of fixed-point numbers to floating-point numbers dependent on the location of the decimal point within the fixed-point numbers.

In contrast, when integer hardware is being used to process fixed-point data, whether half word or long word, it will only be operable to process those data values as though they were integer values, i.e. where the decimal point is assumed to always be in the same location irrespective of the data values being input, typically immediately to the right of the least significant bit. Accordingly, as shown in FIG. 3A if the integer hardware of the processor receives the 16 bit unsigned value 50 illustrated in FIG. 3A, it will assume that that value is an unsigned integer, (i.e. representing the value 496), irrespective of the fixed-point representation that may be understood by the program executing on the processor. As mentioned earlier, instructions are known which enable an integer value to be converted into a floating-point value, and vice versa, and accordingly the processor could be arranged to execute an instruction to convert the integer value 50 into a floating-point number, for example the single precision floating-point number 60 illustrated in FIG. 3A. In floating-point format, it will be appreciated that the value 496 is represented as $1.1111 \times 2^8$. Removing the leading 1, then the fraction value becomes 11110 . . . 0 as illustrated in FIG. 3A. With regards to the exponent, the IEEE 754/1985 standard defines adding a bias of hexadecimal 7F, and when this bias is added to the value 8 it will be appreciated that this will be an exponent value of 10000111. Further, since the value is positive, the sign bit will be 0.

Figure 3B:
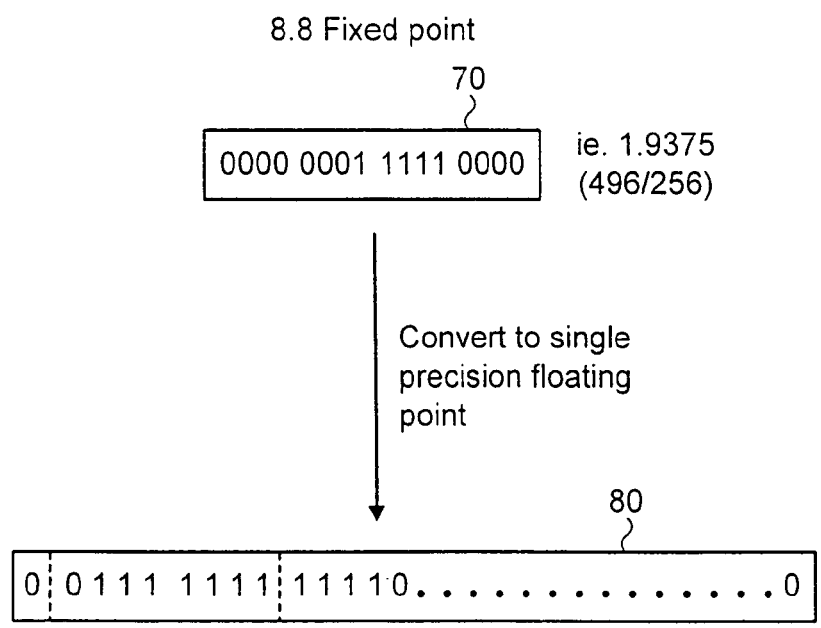

However, it will be appreciated that if in fact within the program the fixed-point number is of the form U(8, 8), i.e. it is an unsigned fixed-point value with 8 bits to the left of the decimal point and 8 bits to the right of the decimal point, then the actual value understood by the program for the 16 bit value 70 illustrated in FIG. 3B is 1.9375 (i.e. 496 divided by 256). However the integer hardware will treat the value as an integer, and if the known conversion process were applied to convert the value 70 into a single precision floating-point number, then this will still result in the single precision floating-point number 60 illustrated in FIG. 3A. However, it will be appreciated by those skilled in the art that the actual correct floating-point number is that referenced by the numeral 80 in FIG. 3B, and hence if a known technique were used for converting an integer into a floating-point number, further instructions would then be needed to modify the result to achieve the correct floating-point number 80. These extra instructions would typically take the form of a multiply, a divide, or a shift type operation.

Hence, to convert a true fixed-point representation of a number (i.e. one where the location of the decimal point within the value is programmable) into a floating-point number, or vice versa, will in accordance with known techniques require the execution of multiple instructions on the processing hardware, a first instruction being used to convert between an integer format and the floating-point format, or vice versa, and one or more further instructions then being used to correct the result having regard to the particular fixed-point representation.

As mentioned earlier, there are a variety of implementations in which cost and size considerations have until recently dictated that only integer processing logic be provided within the processor. One example is in the embedded processor environment, where inexpensive low power processors are required, for example to perform CODEC speech processing within a mobile phone, etc. The inventors realised that such processing could be more reliably and quickly performed by floating-point hardware, and that current technology no longer makes it prohibitive to consider also including floating-point hardware within such embedded processors. However, to enable such potential benefits to be realised, it is very important that the embedded processor is able to quickly convert numbers from the fixed-point representation (having programmable decimal point locations) to the floating-point representation, and vice versa. The above described approach for performing the conversion was considered unacceptable, as it is not quick enough, and requires a larger program space to accommodate the additional processing instructions required to correct the result of the conversion to a floating-point representation of the fixed-point value as an integer, or vice versa.

In accordance with embodiments, a set of instructions are proposed which provide for direct, fast conversion of fixed-point data, signed or unsigned, 16-bit or 32-bit, to single-precision or double-precision floating-point data, and vice versa. The instructions are of the form:

F(SU)(HL)TO(SD)—convert signed/unsigned, half-word/long-word to single/double

FTO(SU)(HL)(SD)—convert single/double to signed/unsigned, half-word/long-word

In preferred embodiments, for fixed-point to floating-point conversions, the instructions would specify a source register for the input operand, and a value specifying the location of the decimal point within the fixed-point representation. A destination register could also be specified if required, but in preferred embodiments is not required to be specified as the destination register is the same register as the source register. The value specifying the location of the decimal point is critical, in that it specifies how the fixed-point data should be treated by the processor in the conversion. In a preferred embodiment, a 0 value for this last term would specify integer data. For floating-point to fixed-point conversions, the same information would be provided within the instructions. In preferred embodiments 16 variants of this new format conversion instruction are provided to cover conversion between the two different types of floating-point representation and the four different types of fixed-point representation used in preferred embodiments, these instructions being as follows:

Signed to Floating-Point

FSHTOS—Conversion from signed half-word to single-precision

FSHTOD—Conversion from signed half-word to double-precision

FSLTOS—Conversion from signed long-word to single-precision

FSLTOD—Conversion from signed long-word to double-precision

Unsigned to Floating-Point

FUHTOS—Conversion from unsigned half-word to single-precision

FUHTOD—Conversion from unsigned half-word to double-precision

FULTOS—Conversion from unsigned long-word to single-precision

FULTOD—Conversion from unsigned long-word to double-precision

Floating-Point to Signed

FTOSHS—Conversion from single-precision to signed half-word

FTOSHD—Conversion from double-precision to signed half-word

FTOSLS—Conversion from single-precision to signed long-word

FTOSLD—Conversion from double-precision to signed long-word

Floating-Point to Unsigned

FTOUHS—Conversion from single-precision to unsigned half-word

FTOUHD—Conversion from double-precision to unsigned half-word

FTOULS—Conversion from single-precision to unsigned long-word

FTOULD—Conversion from double-precision to unsigned long-word

In a particularly preferred embodiment, where these instructions are provided within the ARM instruction set developed by ARM Limited, each instruction has a specific opcode portion, preferably 0b1111, and then an extended opcode portion to define the particular variant of format conversion instruction. In practice, the 16 different instructions consist of 8 basic instructions as illustrated in the table below:

TABLE 1

| Extended opcode | Name | Operation |
|---|---|---|
| 10100 | FSHTO | Fd = ConvertSignedHalftoSingle/Double(Fd) |
| 10101 | FSLTO | Fd = ConvertSignedLongtoSingle/Double(Fd) |
| 10110 | FUHTO | Fd = ConvertUnsignedHalftoSingle/Double(Fd) |
| 10111 | FULTO | Fd = ConvertUnsignedLongtoSingle/Double(Fd) |
| 11100 | FTOSH | Fd = ConverttoSignedHalf(Fd) |
| 11101 | FTOSL | Fd = ConverttoSignedLong(Fd) |
| 11110 | FTOUH | Fd = ConverttoUnsignedHalf(Fd) |
| 11111 | FTOUL | Fd = ConverttoUnsignedLong(Fd) |

In this particularly preferred embodiment, the operand Fm contains the location of the decimal point, and has a value ranging from 0-31, whilst the operand Fd specifies both the source and destination register. The original fixed-point or floating-point source is overwritten by the result of the conversion.

In preferred embodiments, these instructions are executed in the floating-point hardware of the processor, which as will be appreciated will include an exponent processing path and a significand processing path. In preferred embodiments, the existing logic within these two paths is used to perform the format conversion operation specified by the format conversion instruction, with only a minor modification to the logic in the exponent path being required, as will be discussed in more detail later. In a particularly preferred embodiment, the processor utilises the floating-point multiply-accumulate (FMAC) pipeline for performing the conversion operations, but it will be appreciated by those skilled in the art that other pipelines could also be used.

Figure 4:
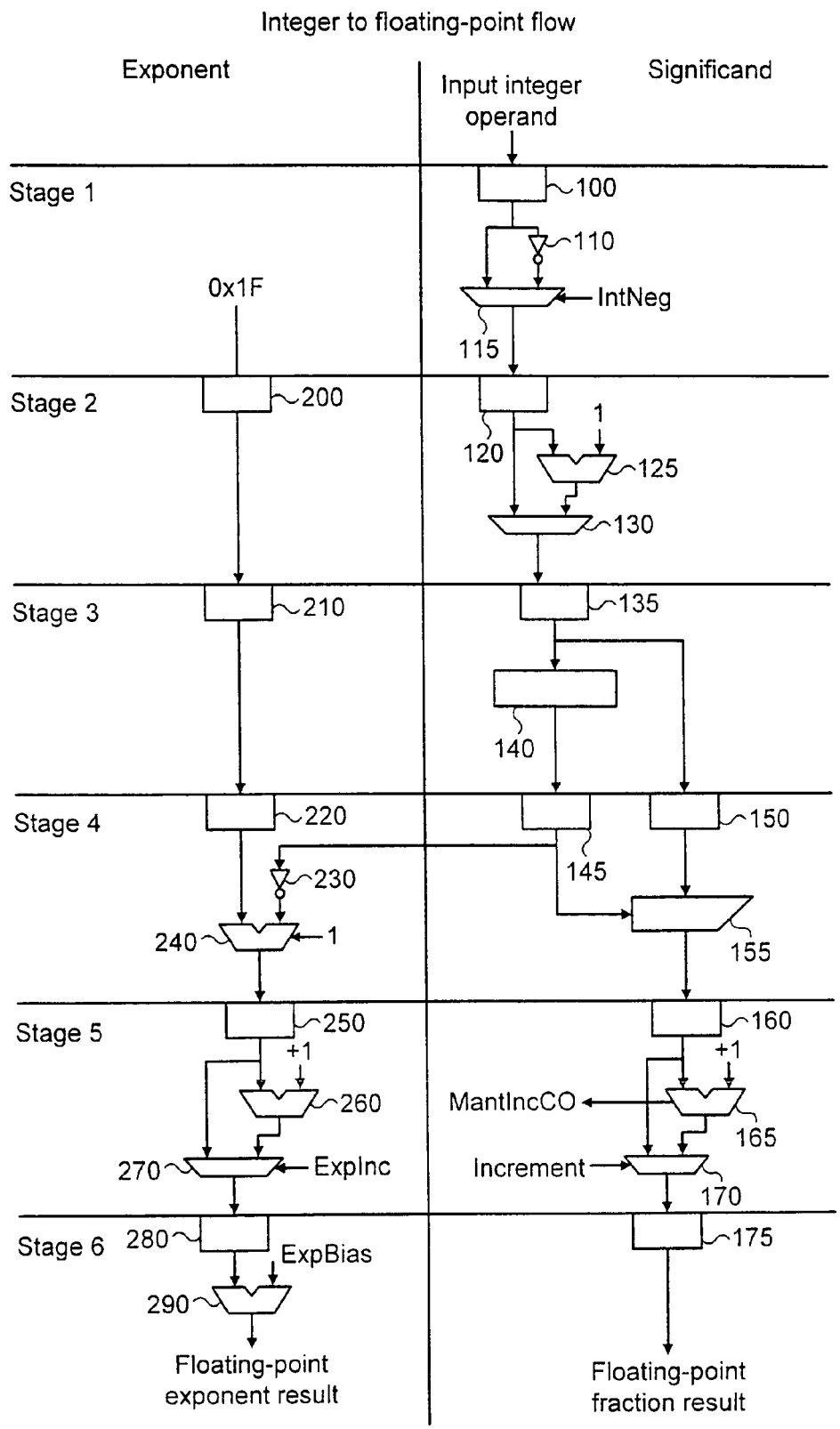
FIG. 4 illustrates the relevant logic provided within a typical pipelined processor to convert an integer value to a corresponding floating-point value.

Considering now the conversion of a fixed-point representation of a number into a corresponding floating-point representation of that number, FIG. 4 illustrates schematically the relevant logic provided within both the exponent path and the significand path of an existing floating-point processing unit. As discussed previously, the existing conversion process only allows an integer to be converted into a floating-point representation, and the process for performing such conversion will now be discussed with reference to FIG. 4.

For an integer to floating-point conversion, only the integer value is received as an operand, and is stored in register 100. In stage 1, the initial exponent value is forced to the hexadecimal value 1 F and stored within the register 200, whilst referring to the significand path, if the integer is positive, it is passed unchanged through multiplexer 115 into register 120. However if the integer is negative, it is inverted by inverter 110, and then routed via the multiplexer 115 into the register 120.

In stage two, no further work is done on the exponent which passes unchanged into register 210, whilst with regards to the significand path, if the integer was negative it is incremented by 1 within an incrementer 125, and then passed via multiplexer 130 into register 135, thereby completing the 2's complement operation. This results in a positive value for the input integer.

In the third stage, no work is again performed on the exponent, which passes unchanged into the register 220, whilst in the significand path the now unsigned integer value is input to the leading 0 adder (LZA) 140 which then outputs a count of the number of leading 0 bits within the unsigned integer for storing in the register 145. In addition, the unsigned integer is routed from register 135 into register 150.

In the fourth stage, the exponent is decremented by the leading 0 count output from register 145, such that the exponent now represents the final exponent before adjustment for rounding, this final exponent being stored within the register 250. To achieve this decrementing process, the leading 0 count is inverted by inverter 230, and then added, along with the addition of a logic 1 value, to the current exponent by the adder logic 240, this producing the same result as would be achieved by decrementing the exponent by the leading 0 count. Within the significand path, the integer is shifted to the left to place the leading one in the integer bit position for the destination precision of the floating-point number, this being achieved by the shifter 155, with the result then being placed within the register 160.

In stage five, the exponent is incremented by the incrementer 260 in preparation for a rounding significand overflow. Within the significand path, the floating-point significand is incremented by the incrementer 165 and then input to the multiplexer 170, which also receives the unincremented significand. An increment signal is input to the multiplexer 170 which is driven dependent on the rounding mode being employed to indicate whether the rounding process will result in the significand value being incremented or not, with the output from the multiplexer 170 then being stored within the register 175. The carry-out signal from the incrementer 165 is then used to control an exponent increment signal input to multiplexer 270 to control incrementation of the exponent as required, with the output from the multiplexer 270 then being stored within the register 280.

Finally, in stage 6, the final exponent is rebiased by adder 290 and written to the destination register file, whilst the fraction of the final significand is then written out to the register file. In addition, it will be appreciated that a sign bit will also be set within the destination register.

Some examples of conversions between integers and floating-point numbers are given in the following two tables below, table 2 illustrating the process of conversion of a positive long-word integer into a single-precision floating-point representation, and table 3 illustrating the conversion of a negative long-word signed integer into a single-precision floating-point representation. Table 2 is provided below and illustrates the flow of the signals through the logic of FIG. 4 in order to convert the following integer value:

TABLE 2

IntValue = 0x0FFFFFF9 = 268,435,449

| Stage | Exponent | Significand | Notes |
|---|---|---|---|
| Initial data | — | 0x0FFFFFF9 | Only the integer value is an operand |
| 1 | 0x1F | 0x0FFFFFF9 | Int is positive, no inversion. Initial Exponent is 0x1F. |
| 2 | 0x1F | 0x0FFFFFF9 | Likewise, no increment |
| 3 | 0x1F | 0x0FFFFFF9 | LZA returns 4 |
| 4 | 0x1B | 0xFFFFFF90 | Shift 4 places to the left, decrement exponent by 4 |
| 5 | 0x1C | 0x800000 | The integer has more bits than the single-precision destination (which is 24 bits), requiring a rounding operation. The rounding bits are 10010000 (i.e. 0x90), setting the guard bit to a 1 and the sticky bit to a 1. In Round-to-Nearest mode, this requires an increment of the significand. The increment of the significand causes a carry-out of the incrementer and producing a value of $2.0 \times 2^{27}$. This must be renormalized by a right shift of 1 place and an increment of the exponent. The incremented exponent is now 0x1C. |
| 6 | 0x9B | 0x000000 (fraction) | Exponent is rebiased by adding 0x7F. The fraction is formed by removing the integer bit and returning only the bits to the right of the decimal point. The final single-precision result is 0x4d800000 (once sign bit of 0 added as msb), equal to 268,435,456. |

Table 3 is provided below and illustrates the processing performed within the diagram of FIG. 4 to perform the conversion of the following integer value:

TABLE 3

IntValue = 0xFFFFFDAB = −597

| Stage | Exponent | Significand | Notes |
|---|---|---|---|
| Initial data | — | 0xFFFFFDAB | Only the integer value is an operand |
| 1 | 0x1F | 0x00000254 | Int is negative, it is inverted. Initial Exponent is 0x1F |
| 2 | 0x1F | 0x00000255 | The inverted integer is incremented to complete the 2's complement operation. The hex value 0x255 is +597 |
| 3 | 0x1F | 0x00000255 | LZA returns 22 (decimal) |
| 4 | 0x09 | 0x95400000 | Shift 22 places to the left, decrement exponent by 22 (decimal) which is 16 hex. |

TABLE 3-continued

IntValue = 0xFFFFFDAB = −597

| Stage | Exponent | Significand | Notes |
|---|---|---|---|
| 5 | 0x09 | 0x954000/00 | The integer has fewer bits than the single-precision destination, so no rounding is required. |
| 6 | 0x88 | 0x154000 (fraction) | Exponent is rebiased by adding 0x7F. The fraction is formed by removing the integer bit and returning only the bits to the right of the decimal point. The final single-precision result is 0xC4154000 (once sign bit of 1 added as msb), equal to −597 |

As mentioned earlier, if these integer values in fact are understood within the program as having a particular fixed-point representation with the decimal point location in a position other than immediately to the right of the least significant bit, then further instructions would need to be executed by the processor in order to manipulate the resulting floating-point representation so that it represents the desired value. In preferred embodiments, this requirements is removed by use of the logic illustrated in FIG. 5, along with execution of one of the earlier described format conversion instructions, which enable a fixed-point value to be directly converted into the required floating-point format.

Figure 5:
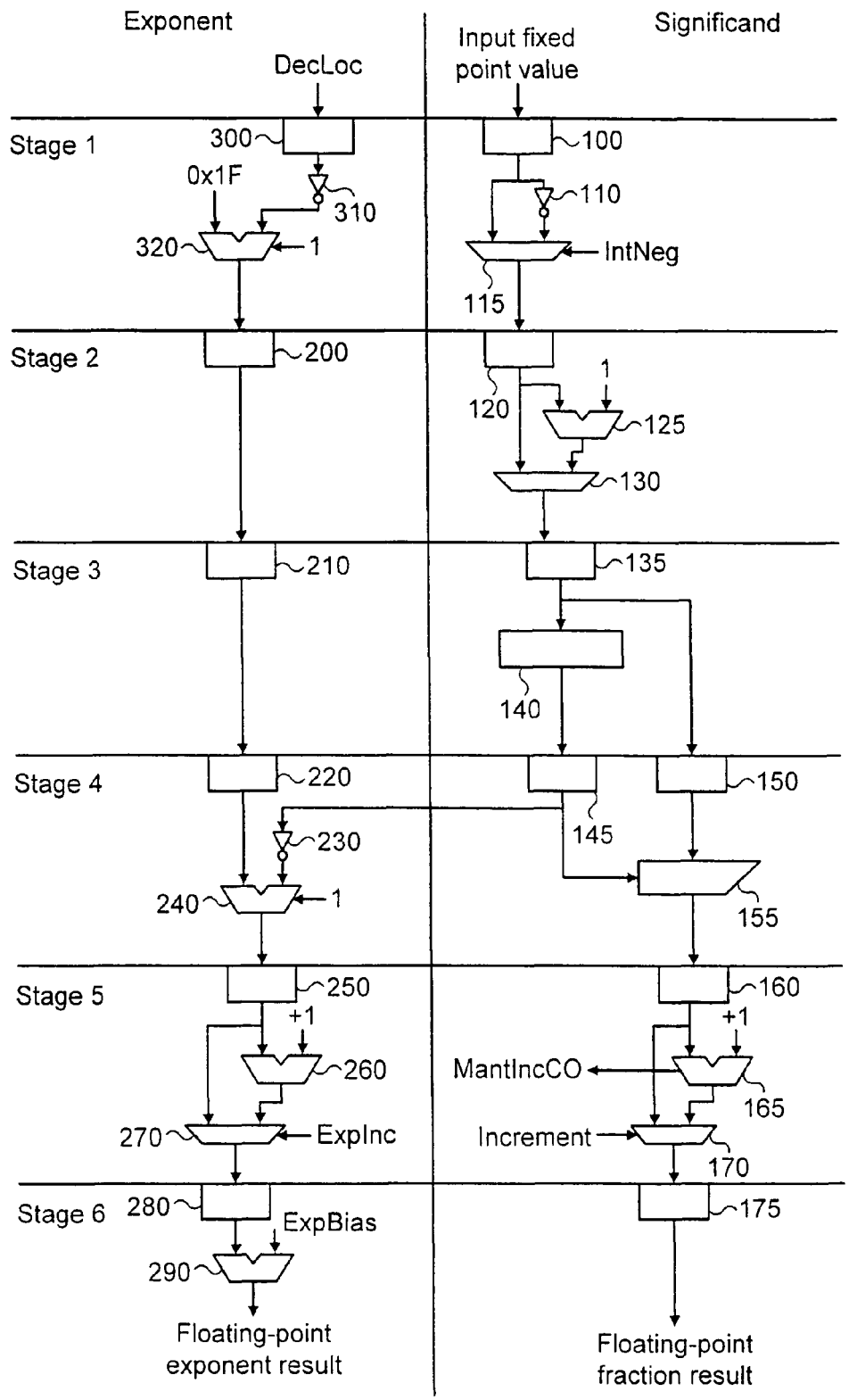
FIG. 5 illustrates the relevant logic provided within a pipelined processor of preferred example embodiments to enable a single instruction to be used to convert a fixed-point number into a corresponding floating-point number.

Those logic elements of FIG. 5 which are identical to those described earlier with reference to FIG. 4 have been referenced with the same reference numerals. It will be appreciated from FIG. 5 that the only modification required is within stage one of the exponent path to enable the initial exponent value to be adjusted in accordance with the value specifying the location of the decimal point within the fixed-point representation, as mentioned earlier this value being specified within the format conversion instruction, and being referred to herein as the DecLoc value. Hence, as is apparent from FIG. 5, again only the fixed-point value is an operand which is stored within the register 100. However, the DecLoc value is also stored within the register 300 to enable an adjustment of the initial exponent value to be made. More particularly, in the first stage, the initial exponent value hexadecimal 1 F is modified by the subtraction of the DecLoc value therefrom to produce a revised initial exponent value to be stored within the register 200. In the embodiment illustrated in FIG. 5, this process is achieved by inverting the DecLoc value at inverter 310, and then adding it, along with the addition of a logic 1 value, to the initial exponent value within the adder 320 to produce the revised initial exponent value. Other than this processing within stage 1 of the exponent path, all of the other processing is exactly as described earlier with reference to FIG. 4.

An example of how a single format conversion instruction of preferred example embodiments can be used to directly convert a fixed-point value into .a corresponding floating-point format will now be illustrated with reference to table 4 below. In this example, the input operand is a positive long-word fixed-point value with 16 integer bits and 16 fraction bits, which as a 32-bit value has the same sequence of bits as the earlier described integer example of table 2. However, it will be appreciated that a different single-precision floating-point number is required to be generated to account for the fact that the input operand for the example in table 4 does in fact represent a different number to the input operand described earlier with reference to table 2. Table 4 is provided below, for the example where the input operand is as follows:

TABLE 4

FixedPointValue = 0x0FFFFFF9 = 268,435,449/2^16 = 4095.999893

| Stage | Exponent | Significand | Notes |
|---|---|---|---|
| Initial data | | 0x0FFFFFF9 | Only the fixed-point value is an operand |
| 1 | 0x0F | 0x0FFFFFF9 | Int is positive, no inversion. Compute revised initial exponent (0x1F + ~0x10 + 1) |
| 2 | 0x0F | 0x0FFFFFF9 | Likewise, no increment |
| 3 | 0x0F | 0x0FFFFFF9 | LZA returns 4 |
| 4 | 0x0B | 0xFFFFFF90 | Shift 4 places to the left, decrement exponent by 4 |
| 5 | 0x0C | 0x800000 | The integer has more bits than the single-precision destination (which is 24 bits), requiring a rounding operation. The rounding bits are 10010000 (i.e. 0x90), setting the guard bit to a 1 and the sticky bit to a 1. In Round-to-Nearest mode, this requires an increment of the significand. The increment of the significand causes a carry-out of the incrementer and producing a value of 2.0x2 27. This must be renormalized by a right shift of 1 place and an increment of the exponent. The incremented exponent is now 0x0C. |
| 6 | 0x8B | 0x000000 (fraction) | Exponent is rebased by adding 0x7F. The fraction is formed by removing the integer bit and returning only the bits to the right of the decimal point. The final single-precision result is 0x45800000 (once sign bit of 0 added as msb), equal to 4096. |

With reference to the above Table 4, the format of the fixed-point operand is S(15,16), specifying a DecLoc value of 16 (decimal) and 10 (hexadecimal). The operand, 0x0FFFFFF9, interpreted as an integer has the value 268,435,449. The same value, interpreted as S(15,16) may be computed in a number of ways, but the simplest method is to divide the number computed when the operand is interpreted as a signed integer (S(31,0)), which is 268,435,449, by $2^{16}$. When this is done, the resulting value is 4095.999893.

In the first stage, the DecLoc value of 10 (hexadecimal) is subtracted from the initial exponent value of 1 F (hexadecimal) by inverting the DecLoc value in inverter 310 and adding this value to the initial exponent value in an adder with an input carry of 1. The resulting initial exponent value is 0 F (hexadecimal).

From the above table, it will be appreciated that the fixed-point value 4095.999893 is converted directly into the required single-point precision floating-point format by a single instruction, and a single routing of the values through the logic illustrated in FIG. 5. As mentioned earlier, this would not be possible in the prior art, since in the prior art, the first pass through the logic of FIG. 4 would have produced the single-precision floating-point value illustrated in the last entry of table two, with further manipulation then being required to produce the required single-precision representation.

A second example of how the logic illustrated in FIG. 5 can be used with the new format conversion instructions described earlier is given below with reference to table 5, where the following fixed-point value is converted (this being a negative long-word fixed-point value with 24 integer bits and 8 fraction bits):

TABLE 5

FixedPointValue = 0xFFFFFDAB = −2.33203125

| Stage | Exponent | Significand | Notes |
|---|---|---|---|
| Initial data | | 0xFFFFFDAB | Only the integer value is an operand |
| 1 | 0x17 | 0x00000254 | Int is negative, it is inverted. Compute revised initial exponent (0x1F + ~0x08 + 1) |
| 2 | 0x17 | 0x00000255 | The inverted integer is incremented to complete the 2's complement operation. The hex value 0x255 is +597 |
| 3 | 0x17 | 0x00000255 | LZA returns 22 (decimal) |
| 4 | 0x01 | 0x95400000 | Shift 22 places to the left, decrement exponent by 22 (decimal) which is 16 hex. |
| 5 | 0x01 | 0x954000/00 | The integer has fewer bits than the single-precision destination, so no rounding is required. |
| 6 | 0x80 | 0x154000 (fraction) | Exponent is rebased by adding 0x7F. The fraction is formed by removing the integer bit and returning only the bits to the right of the decimal point. The final single-precision result is 0xC0154000 (once sign bit of 1 added as msb), equal to −2.33203125 |

With reference to the above Table 5, the format of the fixed-point operand is S(23,8), specifying a DecLoc value of 8 (decimal) and 8 (hexadecimal). The operand, 0xFFFFFDAB, interpreted as an integer has the value −597. The same value, interpreted as S(23,8) may be computed in a number of ways, but the simplest method is to divide the number computed when the operand is interpreted as an integer (S(31,0)), which is −597, by $2^8$. When this is done, the resulting value is −2.33203125.

In the first stage, the DecLoc value of 08 (hexadecimal) is subtracted from the initial exponent value of 1 F (hexadecimal) by inverting the DecLoc value in inverter 310 and adding this value to the initial exponent value in an adder with an input carry of 1. The resulting initial exponent value is 17 (hexadecimal).

Figure 6:
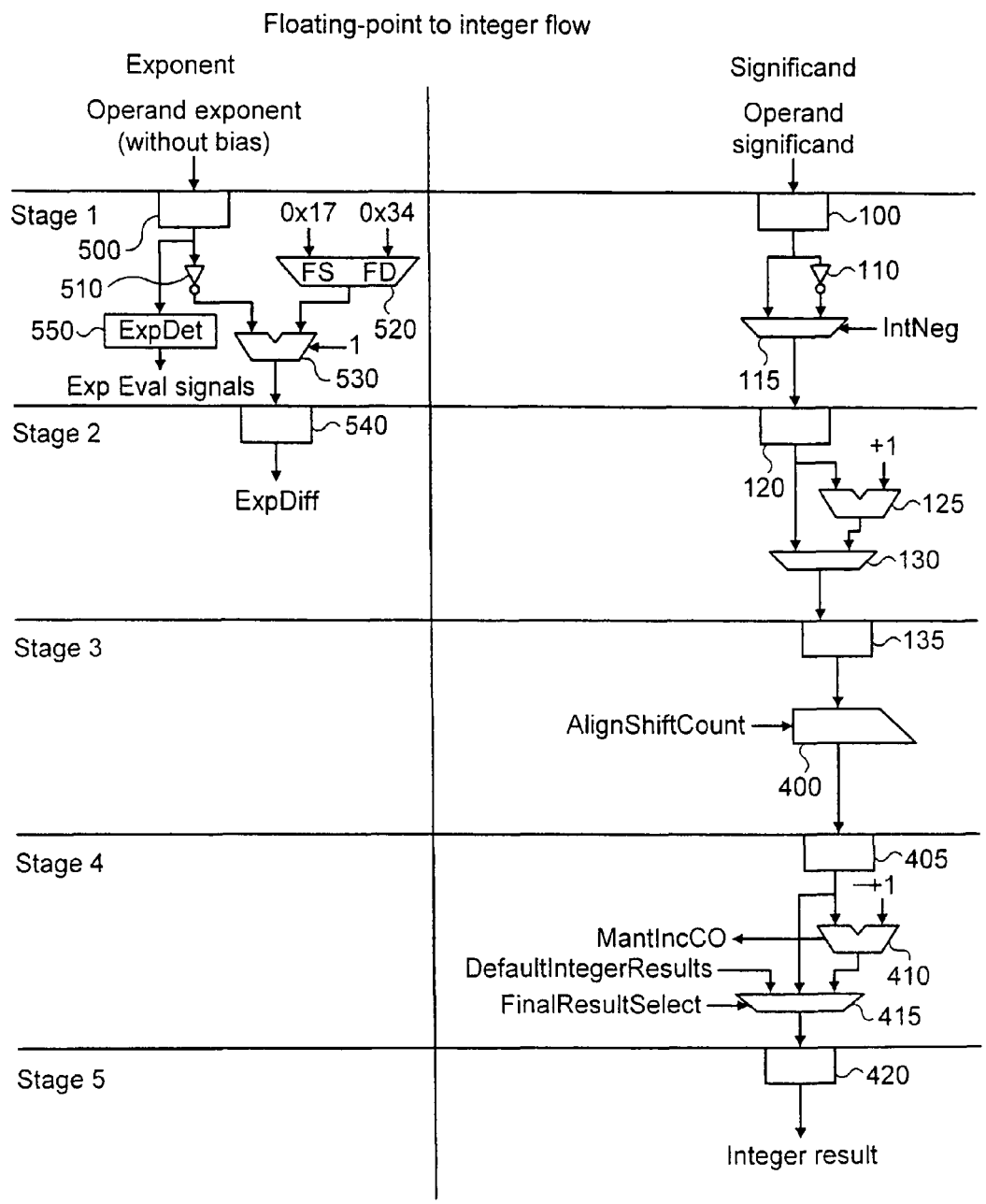
FIG. 6 is a block diagram illustrating the relevant logic provided within a typical pipelined processor to enable a floating-point number to be converted into a corresponding integer value.

Having described the conversion from fixed-point to floating-point representations, a description of the conversion from floating-point representations to fixed-point representations will now be described with reference to FIGS. 6 and 7. FIG. 6 illustrates the relevant components within an existing floating-point pipelined processor that may be used to convert in the standard manner a floating-point value to an integer value. By comparison with FIG. 4, it will be appreciated that one less stage has been illustrated. In practice, it will be appreciated that the pipeline may well include a further stage between stages 3 and 4 as illustrated in FIG. 6, but since in preferred embodiments the processing logic within that stage is not used by the format conversion operation that stage has been omitted from the diagram.

Only the floating-point value is an operand to the process, with the significand being input to the register 100, and the exponent (with the bias removed) being input into the register 500. Within the exponent path, at stage 1, the exponent is subtracted from a predetermined value, which in the embodiment illustrated in FIG. 6 is hexadecimal 17 for single precision or hexadecimal 34 for double precision, this resulting in the generation of a difference factor (referred to as ExpDiff), this value being stored within the register 540. The selection of the predetermined value dependent on single precision or double precision is made by the multiplexer 520, and the subtraction step is performed by inverting the exponent using the inverter 510, and then adding the inverted exponent, along with a logic 1 value, to the output of the multiplexer 520 within the adder 530.

Additionally, within stage 1 of the exponent path, exception detection logic 550 is used to produce exponent evaluation signals, including an out of range exception signal indicating whether the input operand floating-point number can or cannot be represented within the range of the fixed-point representation to be generated by the format conversion instruction. It will be appreciated that the range for the fixed-point representation will be dependent on whether the fixed-point representation is signed or unsigned, whether it is half word or long word, and dependent on where the decimal point location is. Further, it will be appreciated that floating-point numbers inherently enable a larger range of values to be represented than the equivalent fixed-point representations, and accordingly when converting from a floating-point representation to a fixed-point representation, it is possible that the destination fixed-point representation will not be able to represent the input number. In situations where the exception detection logic 550 determines that an out of range exception will occur, i.e. the input floating-point operand exceeds the maximum value (i.e. maximum negative value or maximum positive value for a signed fixed-point representation, or the maximum positive value for an unsigned fixed-point representation, dependent on the target fixed-point representation), then it will as discussed later either cause a default result to be generated for the integer result or will invoke an exception handling routine to deal with the exception.

Within the significand path, the input operand is processed through stages 1 and 2 in the same way as described earlier with reference to FIG. 4, and accordingly a positive operand passes through unchanged, whilst a negative operand is placed into 2's complement form, with the operand then being stored in register 135.

From FIG. 6, it will be appreciated that after stage 1, no further work is performed on the exponent. In stage 3 of the significand path, the floating-point significand output by register 135 is shifted right based on an AlignShiftCount value derived from the ExpDiff signal such that the bit in the input floating-point operand with the weight of $2^0$ is then in the least significant bit position of the final integer. The result is then stored in the register 405.

In stage 4, rounding is performed on the value within the register 405, with the logic elements 410, 415 performing the same operation as described earlier with reference to elements 165 and 170 of FIG. 4, with the final rounded result then being placed within the register 420. As mentioned earlier, if the exception detection logic 550 has determined that an out of range exception will occur, then (assuming the processor is not set up to invoke an exception handling routine at stage 1 upon detection of the out of range exception) a default integer result is forced to be output from multiplexer 415 by appropriate selection of the final result select signal input to the multiplexer 415.

In preferred embodiments, the exception detection logic 550 can be arranged to pessimistically determine those situations where an out of range exception may (as opposed to will) occur, i.e. those situations where it is possible that if the rounding process results in the integer being incremented, it will then be out of range. In preferred embodiments, in such instances, the processor is arranged to invoke exception handling code, where the conversion operation is then performed.

Two examples of conversion of single-precision floating-point values to long-word integers will now be provided below with reference to tables 6 and 7, table 6 showing conversion of the single precision floating-point value that was the result of the conversion illustrated earlier with reference to table 2, and table 7 illustrating the conversion of the single precision floating-point value that was the result of the operation illustrated in table 3:

TABLE 6

FPValue = 0x4d800000 = $1.0 \times 2^{28}$ = 268,435,456

| Stage | Exponent | Significand | Notes |
|---|---|---|---|
| Initial data | 0x1C (0x9B before removal of bias) | 0x800000 | Only the floating-point value is an operand. Remove the bias from the exponent. |
| 1 | 0x1C AlignShiftCount is 5 | 0x00800000 | Compute the shift count (0x17 + ~0x1C + 1) = 0x7B, which is negative and represents a left shift of 5. The input FP value is positive, so no inversion is done, but the value is padded with zeros to form a 32-bit value. |
| 2 | | 0x00800000 | Likewise, no increment |
| 3 | | 0x10000000 | Input significand shifted left 5 places. No rounding is possible since all significand bits are greater than 1 and are representable in the long-word integer. |
| 4 | | 0x10000000 | The final integer value does not require increment |
| 5 | | 0x10000000 | The final integer is 0x10000000 = 268,435,456. |

TABLE 7

FPValue = 0xC4154000 = −597

| Stage | Exponent | Significand | Notes |
|---|---|---|---|
| Initial data | 0x09 (0x88 before removal of bias) | 0x954000 | Only the floating-point value is an operand. Remove the bias from the exponent. |
| 1 | 0x09 AlignShiftCount is 14 | 0xFF6ABFFF | Compute shift count (0x17 + ~0x9 + 1) = 0xE (14). The input value is negative, so the significand is inverted and padded with 1's in the msb to form a 32-bit value. |
| 2 | | 0xFF6AC000 | The inverted significand is incremented to complete the 2's complement operation |
| 3 | | 0xFFFFFDAB/00 | The negated significand is shifted right by 14 places, again with 1's fill. The rounding bits are captured and evaluated to determine is an increment is require. In this example, all bits shifted out in the shifting operation are zero. |
| 4 | | 0xFFFFFDAB | Since all rounding bits are zero, no rounding is required |
| 5 | | 0xFFFFFDAB | 0xFFFFFDAB is a signed integer equal to −597 |

As will be appreciated by those skilled in the art if the program aiming to use the integer resulting from the processing described above with reference to FIG. 6 actually has a fixed-point representation other than where the decimal point is directly to the right of the least significant bit, then further manipulation of the resulting values will be required to put them in the correct fixed-point representation taking account of the location of the decimal point. In accordance with preferred example embodiments, this requirement is removed through the use of the logic illustrated in FIG. 7, along with one of the earlier described format conversion instructions for converting directly between floating-point representations and the required fixed-point representation.

Figure 7:
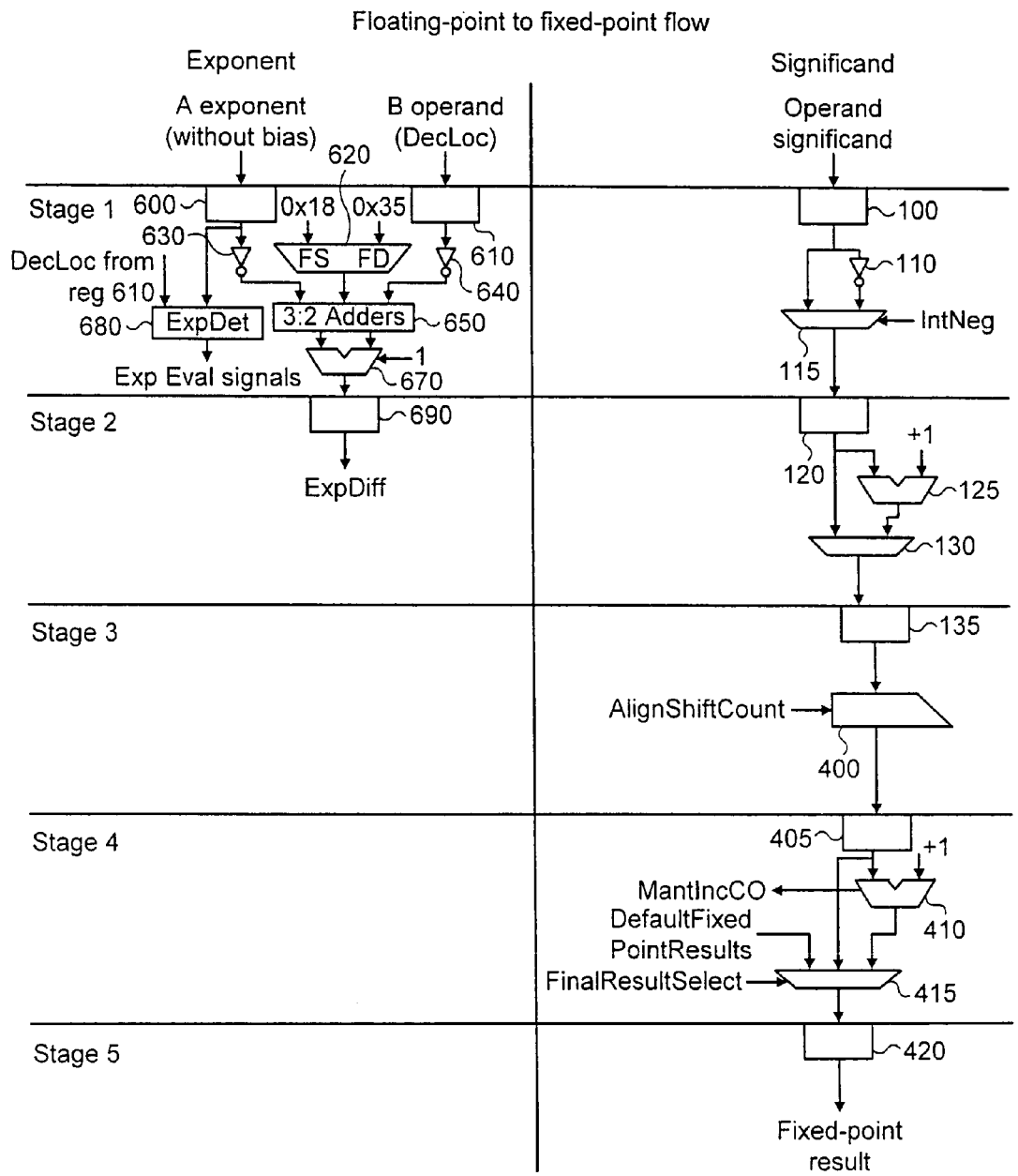
FIG. 7 is a block diagram illustrating the relevant logic provided within a pipelined processor of preferred example embodiments to enable a single instruction to be used to convert a floating-point number into a corresponding fixed-point number.

As can be seen from a comparison of FIG. 6 with FIG. 7, the significand path remains unchanged. However, with regards to stage 1 of the exponent path, the processing is as follows. In this embodiment, the original exponent (with the bias removed) is stored within the register 600, whilst the DecLoc value extracted from the format conversion instruction is placed within the register 610. The initial exponent value and the DecLoc value are then subtracted from a predetermined value, which in preferred embodiments is hexadecimal 18 for single precision floating-point values and hexadecimal 35 for double precision floating-point values. The multiplexer 620 is used to output the appropriate predetermined value to a 3:2 adder logic 650, which also receives as inputs the exponent as inverted by inverter 630 and the DecLoc value as inverted by inverter 640. The adder logic 650, 670 then performs the required subtraction by adding the inverted exponent and inverted DecLoc value to the predetermined value, along with the addition of a logic 1 value, this producing an ExpDiff value representing the difference between the predetermined value and the exponent value as adjusted by the DecLoc value, with that result being placed within the register 690. Thereafter, the process is as described before with reference to FIG. 6.

Two examples of how the floating-point value 0xC4154000 (i.e. −597.0) is converted into different fixed-point formats using the earlier described format conversion instructions and the logic of FIG. 7 will now be illustrated with reference to tables 8 and 9. In table 8 the destination fixed-point format has 16 integer bits and 16 fraction bits in a long-word format, whilst in table 9 the destination fixed-point format has 12 integer bits and 4 fraction bits in a half-word format:

TABLE 8

FPValue = 0xC4154000 = −597.0

| Stage | Exponent | Significand | Notes |
|---|---|---|---|
| Initial data | 0x09 (0x88 before removal of bias) | 0x954000 | Only the floating-point value is an operand. Remove the bias from the exponent. |
| 1 | 0x09 AlignShiftCount is −2 | 0xFF6ABFFF | Compute shift count (0x18 + ~0x9 + ~0x10 + 1) = 0x7E (−2). The input value is negative, so the significand is inverted and padded with 1's in the msb to form a 32-bit value |
| 2 | | 0xFF6AC000 | The inverted significand is incremented to complete the 2's complement operation |
| 3 | | 0xFDAB0000 | The negated significand is shifted left by 2 places, with zero fill in the lsb and 1's fill |
| 4 | | 0xFDAB0000 | Since no rounding bits were produced due to the left shift, no rounding is required |
| 5 | | 0xFDAB0000 | The fixed-point result is FDAB.0000 in long-word format, equal to −597.0 |

TABLE 9

FPValue = 0xC4154000 = −597.0

| Stage | Exponent | Significand | Notes |
|---|---|---|---|
| Initial data | 0x09 (0x88 before removal of bias) | 0x954000 | Only the floating-point value is an operand. Remove the bias from the exponent. |
| 1 | 0x09 AlignShiftCount is 10 | 0xFF6ABFFF | Compute shift count (0x18 + ~0x9 + ~0x4 + 1) = 0xA (10). The input value is negative, so the significand is inverted and padded with 1's in the msb to form a 32-bit value. |
| 2 | | 0xFF6AC000 | The inverted significand is incremented to complete the 2's complement operation |
| 3 | | 0xFFFFDAB0 | The negated significand is shifted right by 10 places, with 1's fill. |
| 4 | | 0xFFFFDAB0 | No rounding is required |
| 5 | | 0xDAB0 | The fixed-point result is DAB.0 in half-word format, equal to −597.0 |

As will be appreciated from a review of the above two tables, a single instruction can be used to cause a single passage of the data through the logic of FIG. 7 in order to directly produce the required fixed-point representation, thereby avoiding the requirement to execute multiple instructions as required by the prior art.

Returning to FIG. 7, the exception detection logic 680 is arranged to produce exponent evaluation signals in an analogous manner to that performed by exception detection logic 550 of FIG. 6. However, the exception detection logic 680 generates the exponent evaluation signals based not only on the exponent value from register 600, but also from the DecLoc value stored in register 610. As mentioned earlier, the out of range exception will occur if the input floating-point value exceeds an upper value for a valid signed or unsigned integer or fixed-point value. Table 10 below illustrates the upper value for a valid signed integer or fixed-point value for both long word and half words for representative values of DecLoc, assuming DecLoc is represented in five bits as an integer value between 0 and 31, table 10 assuming a single-precision floating-point to signed fixed-point conversion:

TABLE 10

| DecLoc (5 bits) | Integer Signed Maximum negative and positive values | Fixed-point Signed long-word maximum negative and positive values | Fixed-point Signed half-word maximum negative and positive values |
|---|---|---|---|
| 0 | $\pm(2^{31}\text{-}2^7)$ | $\pm(2^{31}\text{-}2^7)$ | $\pm(2^{15}\text{-}2^0)$ |
| 1 | NA | $\pm(2^{30}\text{-}2^6)$ | $\pm(2^{14}\text{-}2^{-1})$ |
| 2 | NA | $\pm(2^{29}\text{-}2^5)$ | $\pm(2^{13}\text{-}2^{-2})$ |
| 3 | NA | $\pm(2^{28}\text{-}2^4)$ | $\pm(2^{12}\text{-}2^{-3})$ |
| 4 | NA | $\pm(2^{27}\text{-}2^3)$ | $\pm(2^{11}\text{-}2^{-4})$ |
| 5 | NA | $\pm(2^{26}\text{-}2^2)$ | $\pm(2^{10}\text{-}2^{-5})$ |
| 6 | NA | $\pm(2^{25}\text{-}2^1)$ | $\pm(2^9\text{-}2^{-6})$ |
| 7 | NA | $\pm(2^{24}\text{-}2^0)$ | $\pm(2^8\text{-}2^{-7})$ |
| 8 | NA | $\pm(2^{23}\text{-}2^{-1})$ | $\pm(2^7\text{-}2^{-8})$ |
| 9 | NA | $\pm(2^{22}\text{-}2^{-2})$ | $\pm(2^6\text{-}2^{-9})$ |
| 10 | NA | $\pm(2^{21}\text{-}2^{-3})$ | $\pm(2^5\text{-}2^{-10})$ |
| 11 | NA | $\pm(2^{20}\text{-}2^{-4})$ | $\pm(2^4\text{-}2^{-11})$ |
| 12 | NA | $\pm(2^{19}\text{-}2^{-5})$ | $\pm(2^3\text{-}2^{-12})$ |
| 13 | NA | $\pm(2^{18}\text{-}2^{-6})$ | $\pm(2^2\text{-}2^{-13})$ |
| 14 | NA | $\pm(2^{17}\text{-}2^{-7})$ | $\pm(2^1\text{-}2^{-14})$ |
| 15 | NA | $\pm(2^{16}\text{-}2^{-8})$ | $\pm(2^0\text{-}2^{-15})$ |
| 16 | NA | $\pm(2^{15}\text{-}2^{-9})$ | $\pm(2^{-1}\text{-}2^{-16})$ |
| 17 | NA | $\pm(2^{14}\text{-}2^{-10})$ | $\pm(2^{-2}\text{-}2^{-17})$ |

TABLE 10-continued

| DecLoc (5 bits) | Integer Signed Maximum negative and positive values | Fixed-point Signed long-word maximum negative and positive values | Fixed-point Signed half-word maximum negative and positive values |
|---|---|---|---|
| 18 | NA | $\pm(2^{13}\text{-}2^{-11})$ | $\pm(2^{-3}\text{-}2^{-18})$ |
| 19 | NA | $\pm(2^{12}\text{-}2^{-12})$ | $\pm(2^{-4}\text{-}2^{-19})$ |
| 20 | NA | $\pm(2^{11}\text{-}2^{-13})$ | $\pm(2^{-5}\text{-}2^{-20})$ |
| 21 | NA | $\pm(2^{10}\text{-}2^{-14})$ | $\pm(2^{-6}\text{-}2^{-21})$ |
| 22 | NA | $\pm(2^{9}\text{-}2^{-15})$ | $\pm(2^{-7}\text{-}2^{-22})$ |
| 23 | NA | $\pm(2^{8}\text{-}2^{-16})$ | $\pm(2^{-8}\text{-}2^{-23})$ |
| 24 | NA | $\pm(2^{7}\text{-}2^{-17})$ | $\pm(2^{-9}\text{-}2^{-24})$ |
| 25 | NA | $\pm(2^{6}\text{-}2^{-18})$ | $\pm(2^{-10}\text{-}2^{-25})$ |
| 26 | NA | $\pm(2^{5}\text{-}2^{-19})$ | $\pm(2^{-11}\text{-}2^{-26})$ |
| 27 | NA | $\pm(2^{4}\text{-}2^{-20})$ | $\pm(2^{-12}\text{-}2^{-27})$ |
| 28 | NA | $\pm(2^{3}\text{-}2^{-21})$ | $\pm(2^{-13}\text{-}2^{-28})$ |
| 29 | NA | $\pm(2^{2}\text{-}2^{-22})$ | $\pm(2^{-14}\text{-}2^{-29})$ |
| 30 | NA | $\pm(2^{1}\text{-}2^{-23})$ | $\pm(2^{-15}\text{-}2^{-30})$ |
| 31 | NA | $\pm(2^{0}\text{-}2^{-24})$ | $\pm(2^{-16}\text{-}2^{-31})$ |

Table 11 below gives the equivalent numbers for a single-precision floating-point to unsigned fixed-point conversion:

TABLE 11

| DecLoc (5 bits) | Integer Unsigned Maximum value | Fixed-point Unsigned long-word maximum value | Fixed-point Unsigned half-word maximum value |
|---|---|---|---|
| 0 | $2^{32}\text{-}2^{8}$ | $2^{32}\text{-}2^{8}$ | $2^{16}\text{-}2^{0}$ |
| 1 | NA | $2^{31}\text{-}2^{7}$ | $2^{15}\text{-}2^{-1}$ |
| 2 | NA | $2^{30}\text{-}2^{6}$ | $2^{14}\text{-}2^{-2}$ |
| 3 | NA | $2^{29}\text{-}2^{5}$ | $2^{13}\text{-}2^{-3}$ |
| 4 | NA | $2^{28}\text{-}2^{4}$ | $2^{12}\text{-}2^{-4}$ |
| 5 | NA | $2^{27}\text{-}2^{3}$ | $2^{11}\text{-}2^{-5}$ |
| 6 | NA | $2^{26}\text{-}2^{2}$ | $2^{10}\text{-}2^{-6}$ |
| 7 | NA | $2^{25}\text{-}2^{1}$ | $2^{9}\text{-}2^{-7}$ |
| 8 | NA | $2^{24}\text{-}2^{0}$ | $2^{8}\text{-}2^{-8}$ |
| 9 | NA | $2^{23}\text{-}2^{-1}$ | $2^{7}\text{-}2^{-9}$ |
| 10 | NA | $2^{22}\text{-}2^{-2}$ | $2^{6}\text{-}2^{-10}$ |
| 11 | NA | $2^{21}\text{-}2^{-3}$ | $2^{5}\text{-}2^{-11}$ |
| 12 | NA | $2^{20}\text{-}2^{-4}$ | $2^{4}\text{-}2^{-12}$ |
| 13 | NA | $2^{19}\text{-}2^{-5}$ | $2^{3}\text{-}2^{-13}$ |
| 14 | NA | $2^{18}\text{-}2^{-6}$ | $2^{2}\text{-}2^{-14}$ |
| 15 | NA | $2^{17}\text{-}2^{-7}$ | $2^{1}\text{-}2^{-15}$ |
| 16 | NA | $2^{16}\text{-}2^{-8}$ | $2^{0}\text{-}2^{-16}$ |
| 17 | NA | $2^{15}\text{-}2^{-9}$ | $2^{-1}\text{-}2^{-17}$ |
| 18 | NA | $2^{14}\text{-}2^{-10}$ | $2^{-2}\text{-}2^{-18}$ |
| 19 | NA | $2^{13}\text{-}2^{-11}$ | $2^{-3}\text{-}2^{-19}$ |
| 20 | NA | $2^{12}\text{-}2^{-12}$ | $2^{-4}\text{-}2^{-20}$ |
| 21 | NA | $2^{11}\text{-}2^{-13}$ | $2^{-5}\text{-}2^{-21}$ |
| 22 | NA | $2^{10}\text{-}2^{-14}$ | $2^{-6}\text{-}2^{-22}$ |
| 23 | NA | $2^{9}\text{-}2^{-15}$ | $2^{-7}\text{-}2^{-23}$ |
| 24 | NA | $2^{8}\text{-}2^{-16}$ | $2^{-8}\text{-}2^{-24}$ |
| 25 | NA | $2^{7}\text{-}2^{-17}$ | $2^{-9}\text{-}2^{-25}$ |
| 26 | NA | $2^{6}\text{-}2^{-18}$ | $2^{-10}\text{-}2^{-26}$ |
| 27 | NA | $2^{5}\text{-}2^{-19}$ | $2^{-11}\text{-}2^{-27}$ |
| 28 | NA | $2^{4}\text{-}2^{-20}$ | $2^{-12}\text{-}2^{-28}$ |
| 29 | NA | $2^{3}\text{-}2^{-21}$ | $2^{-13}\text{-}2^{-29}$ |
| 30 | NA | $2^{2}\text{-}2^{-22}$ | $2^{-14}\text{-}2^{-30}$ |
| 31 | NA | $2^{1}\text{-}2^{-23}$ | $2^{-15}\text{-}2^{-31}$ |

It will be appreciated that the corresponding limits for double-precision floating-point numbers can be determined in an analogous manner to that described with reference to Tables 10 and 11 for single-precision floating-point numbers.

For single-precision to half-word conversions, and for double-precision to long-word or half-word conversions, rounding of the result can cause an out of range exception even when the input floating-point value was less than the maximum value given in tables 10 and 11 (or the corresponding tables for double precision). In these cases, the out of range determination is made in stage 1 for cases in which the input floating-point value is greater in absolute magnitude than the destination fixed-point data type maximum value, and in other cases in which the result, after rounding, is greater in absolute magnitude than the destination fixed-point data type maximum value.

Figure 8:
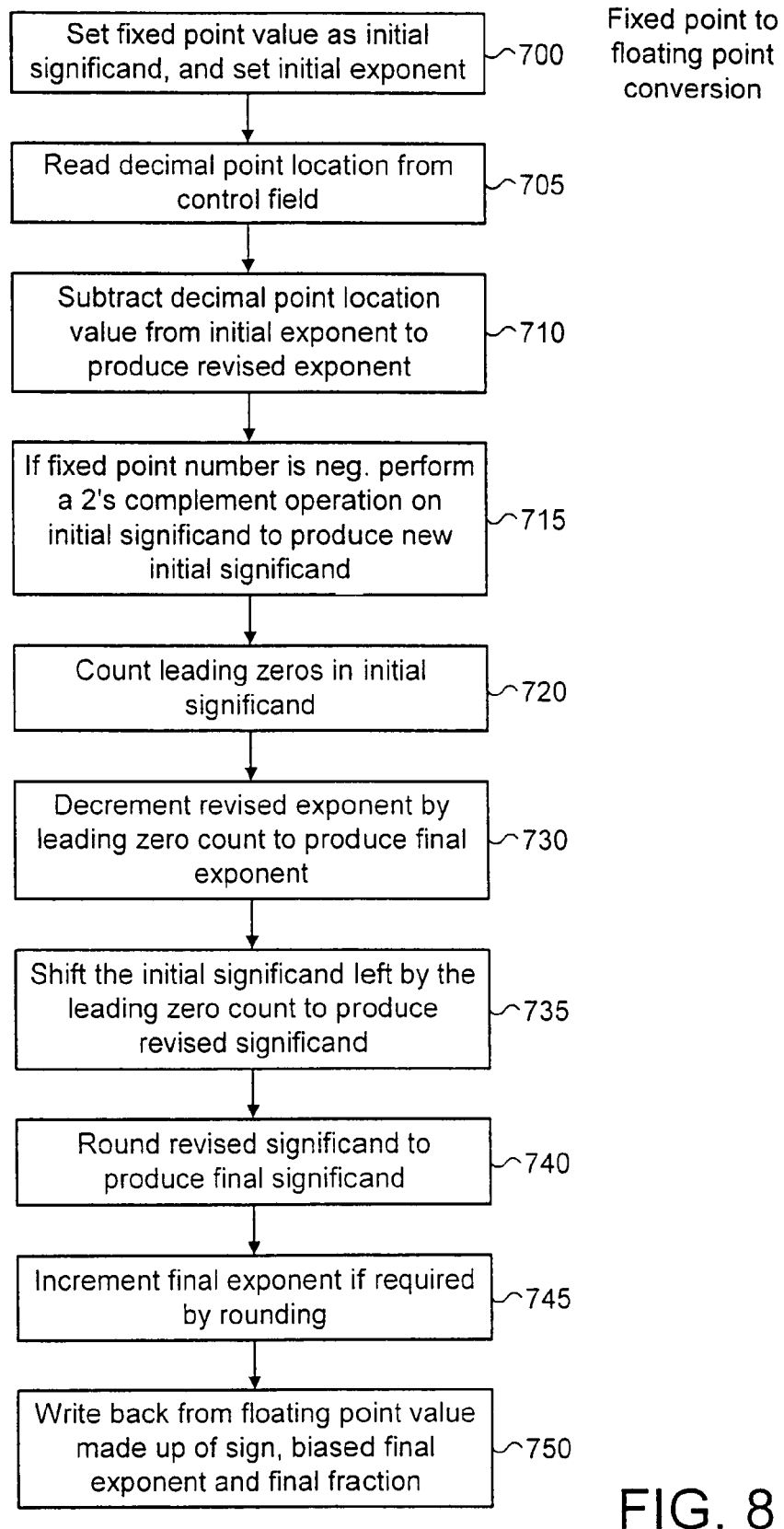
FIG. 8 is a flow diagram illustrating the process performed in preferred example embodiments to convert a fixed-point number into a corresponding floating-point number.
Figure 9:
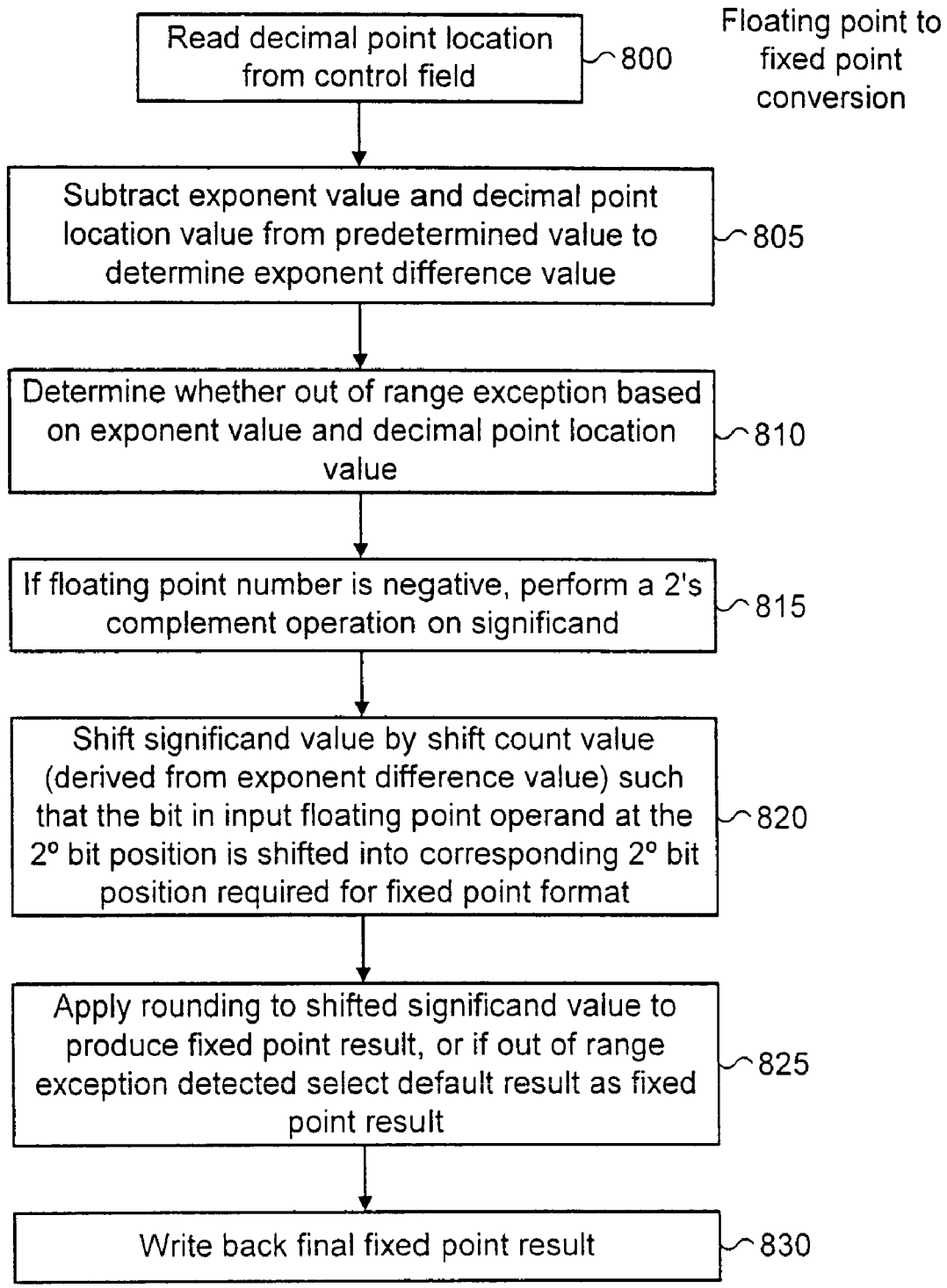
FIG. 9 is a flow diagram illustrating the steps performed in preferred embodiments to convert a floating-point into a corresponding fixed-point number.

For completeness, FIGS. 8 and 9 are provided, which are flow diagrams illustrating the processing steps performed for fixed-point to floating-point conversion, and floating-point to fixed-point conversion, respectively, in accordance with example embodiments. More particularly, FIG. 8 is a flow diagram illustrating the basic flow of the logic illustrated earlier with reference to FIG. 5. Accordingly, at step 700 the input fixed-point value is set as the initial significand, and the initial exponent is set, in the example in FIG. 5 it being set to the hexadecimal value 1F. Then at step 705, the decimal point location information (DecLoc value) is read from the control field of the instruction, after which at step 710 the decimal point location value is subtracted from the initial exponent value to produce the revised exponent (which is stored in register 200 in FIG. 5). Meanwhile at step 715, if the fixed-point number is negative, a two's complement operation is performed on the initial significand to produce a new initial significand, in FIG. 5 this being performed by the logic within stages 1 and 2 of the significand path.

At step 720, the leading zeros in the initial significand are counted, in FIG. 5 this being performed by the LZA 140 in stage 3 of the significand path, after which at step 730 the revised exponent is decremented by the leading 0 count to produce the final exponent (as performed by logic 230, 240 in FIG. 5).

Further, at step 735, the initial significand is shifted left by the leading 0 count to produce a revised significand (as performed by element 155 in FIG. 5). Thereafter, at step 740, the revised significand is rounded as required to produce the final significand placed in register 175, and at step 745 the final exponent is incremented if required by the rounding to produce the final exponent stored in register 280. Finally, at step 750, the floating-point value is written back to the destination register, made up of a sign value, the biased final exponent, and the final fraction (the final fraction being obtained by removing the most significant bit from the significand).

FIG. 9 is a equivalent flow diagram illustrating the process performed in preferred embodiments by the logic illustrated earlier with reference to FIG. 7 for conversion of floating-point values to corresponding fixed-point representations. At step 800, the decimal point location value (DecLoc value) is read from the control field, whereafter at step 805 the exponent value and decimal point location value are subtracted from the predetermined value to determine an exponent difference value (see stage 1 of the exponent path of FIG. 7).

At step 810, it is determined whether an out of range exception has occurred based on the exponent value and the decimal point location value (see element 680 within stage 1 of FIG. 7). This may be the case if the input floating-point value is greater in absolute magnitude than the destination fixed-point data type maximum value, and optionally, if the result, after rounding, may be greater in absolute magnitude than the destination fixed-point data type maximum value. In one embodiment, in such situations, exception handling code is invoked to handle the exception, whilst in other embodiments, the instruction continues down the pipeline with a default value being generated later.

At step 815, a two's complement operation is performed on the significand if the floating-point number is negative, this being performed by the logic in stages 1 and 2 of the significand path of FIG. 7.

At step 820, the significand value is shifted by the shift count value, referred to in FIG. 7 as the AlignShiftCount value, this being derived from the exponent difference value. This is done such that the bit in the input floating-point operand with the weight of $2^0$ is shifted into the corresponding $2^0$ bit position required for the destination fixed-point format. This function is performed by the element 400 of FIG. 7 in preferred embodiments.

Thereafter, at step 825, rounding is applied to the shifted significand value to produce the fixed-point result, or if an out of range exception is detected at this stage the default result may be selected as the fixed-point result (assuming the set-up of the processor requires a default value to be generated for such out-of-range exceptions), this processing in preferred embodiments being performed by the elements illustrated in stage 4 of the significand path of FIG. 7. Thereafter at step 830, the final fixed-point result is written back to the destination register.

From the description of the example embodiments as described above, it will be appreciated that the example embodiments provide a particularly quick and efficient technique for enabling direct conversion between fixed-point representations and floating-point representations, the fixed-point representations having a programmable decimal point location. More particularly, a single instruction can be executed to rapidly perform the conversion, thereby making it viable to introduce floating-point processing logic into processors that until now have only used integer processing logic. Accordingly, the example embodiments provide a technique which will facilitate the introduction of floating-point logic into processors such as embedded processors to enable the benefit of performing certain operations as floating-point computations to be realised.

Although example embodiments have been described herein, it will be appreciated that the claims are not limited thereto and that many modifications and additions thereto may be made within the scope of the claims.

I claim:

1. A data processing apparatus comprising:
   a data processing unit operable to execute instructions;
   the data processing unit being responsive to a format conversion instruction to apply a format conversion operation to a number to perform a conversion between a fixed-point representation of said number and a floating-point representation of said number, a control field being arranged to provide a programmable value specifying a decimal point location within the fixed-point representation of said number, and the data processing unit being operable to reference the control field and to control the format conversion operation in accordance with the programmable value;
   wherein the format conversion instruction is a fixed-point to floating-point conversion instruction and the format conversion operation applied to the number is operable to perform a conversion from a fixed-point representation of said number to a floating-point representation of said number, wherein the format conversion operation includes an exponent generation operation operable to generate an exponent value for the floating-point representation of the number by performing an operation equivalent to subtracting from an initial exponent value a value indicative of the number of leading zeros in the fixed-point representation of the number, and the format conversion operation being operable, prior to said exponent generation operation, to adjust the initial exponent value based on the programmable value provided within the control field.

2. A data processing apparatus as claimed in claim 1, wherein the programmable value is provided as an immediate value within the control field.

3. A data processing apparatus as claimed in claim 1, wherein the control field is arranged to identify an operand register in which the programmable value is stored.

4. A data processing apparatus as claimed in claim 1, wherein a further control field is arranged to specify whether the fixed-point representation of said number is signed or unsigned.

5. A data processing apparatus as claimed in claim 1, wherein the data processing unit is a pipelined processor, and the format conversion operation is performed within a plurality of pipeline stages of the pipelined processor.

6. A data processing apparatus as claimed in claim 5, wherein the pipelined processor is a floating-point pipelined processor comprising exponent processing logic located within the plurality of pipeline stages and significand processing logic located within the plurality of pipeline stages, and the exponent processing logic and significand processing logic are operable to apply the format conversion operation.

7. A data processing apparatus as claimed in claim 1, wherein the data processing unit is a pipelined processor, the format conversion operation being performed within a plurality of pipeline stages of the pipelined processor, and the adjustment of the initial exponent value being performed in a predetermined pipeline stage prior to one or more pipeline stages in which the exponent generation operation is performed.

8. A data processing apparatus as claimed in claim 7, wherein the predetermined pipeline stage comprises adjustment logic operable to adjust the initial exponent value by performing an operation equivalent to subtracting from a default initial exponent value the programmable value provided within the control field.

9. A method of converting a number between a fixed-point representation of said number and a floating-point representation of said number within a data processing apparatus comprising a data processing unit operable to execute instructions, the method comprising the steps of:
   providing within a control field a programmable value specifying a decimal point location within the fixed-point representation of said number; and
   responsive to a format conversion instruction, causing the data processing unit to apply a format conversion operation to said number to perform a conversion between the fixed-point representation of said number and the floating-point representation of said number, including causing the data processing unit to reference the control field and to control the format conversion operation in accordance with the programmable value, wherein the format conversion instruction is a fixed-point to floating-point conversion instruction and the format conversion operation applied to the number is operable to perform a conversion from a fixed-point representation of said number to a floating-point representation of said number, wherein the step of applying the format conversion operation includes the steps of:
   performing an exponent generation operation to generate an exponent value for the floating-point representation of the number by performing an operation equivalent to subtracting from an initial exponent value a value indicative of the number of leading zeros in the fixed-point representation of the number; and
   prior to said exponent generation operation, adjusting the initial exponent value based on the programmable value provided within the control field.

10. A method as claimed in claim 9, wherein the programmable value is provided as an immediate value within the control field.

11. A method as claimed in claim 9, wherein the control field is arranged to identify an operand register in which the programmable value is stored.

12. A method as claimed in claim 9, wherein a further control field is arranged to specify whether the fixed-point representation of said number is signed or unsigned.

13. A method as claimed in claim 9, wherein the data processing unit is a pipelined processor, and the format conversion operation is performed within a plurality of pipeline stages of the pipelined processor.

14. A method as claimed in claim 13, wherein the pipelined processor is a floating-point pipelined processor comprising exponent processing logic located within the plurality of pipeline stages and significand processing logic located within the plurality of pipeline stages, and the method comprises the step of employing the exponent processing logic and the significand processing logic to apply the format conversion operation.

15. A method as claimed in claim 9, wherein the data processing unit is a pipelined processor, the format conversion operation being performed within a plurality of pipeline stages of the pipelined processor, and the step of adjusting the initial exponent value being performed in a predetermined pipeline stage prior to one or more pipeline stages in which the exponent generation operation is performed.

16. A method as claimed in claim 15, wherein the step of adjusting the initial exponent value comprises the step of:
employing adjustment logic within the predetermined pipeline stage to adjust the initial exponent value by performing an operation equivalent to subtracting from a default initial exponent value the programmable value provided within the control field.

17. A computer program stored in a non-transitory storage medium and containing a format conversion instruction operable to configure a data processing apparatus to perform a method as claimed in claim 9.

* * * * *